US010453534B2

United States Patent
Hoayun (10) Patent No.: US 10,453,534 B2
(45) Date of Patent: Oct. 22, 2019

(54) PATCHING OF PROGRAMMABLE MEMORY

(71) Applicant: Qualcomm Technologies International, Ltd., Cambridge (GB)

(72) Inventor: Paul Hoayun, Cambridge (GB)

(73) Assignee: QUALCOMM TECHNOLOGIES INTERNATIONAL, LTD., San Diego, CA (US)

( * ) Notice: Subject to any disclaimer, the term of this patent is extended or adjusted under 35 U.S.C. 154(b) by 559 days.

(21) Appl. No.: 13/960,940

(22) Filed: Aug. 7, 2013

(65) Prior Publication Data
US 2015/0046630 A1    Feb. 12, 2015

(51) Int. Cl.
*G11C 16/10* (2006.01)
*G06F 12/06* (2006.01)
*G06F 8/65* (2018.01)

(52) U.S. Cl.
CPC .............. *G11C 16/107* (2013.01); *G06F 8/66* (2013.01); *G06F 12/0638* (2013.01)

(58) Field of Classification Search
CPC ...... G06F 9/44521; G06F 9/4425; G06F 8/65; G06F 11/3612; G06F 2209/481; G06F 9/4812; G06F 8/67; G06F 11/3636; G06F 9/328; G06F 8/66; G06F 21/125; G06F 12/0638; G06F 3/0607; G06F 8/60; G06F 9/44557; G06F 8/61; G06F 9/322; G06F 9/3004; G06F 9/24; G06F 9/268; G06F 21/572
USPC ......... 711/112, E12.083, 102, E12.002, 103, 711/170, E12.008, 133, 165, 202; 712/E9.015, E9.075
See application file for complete search history.

(56) References Cited

U.S. PATENT DOCUMENTS

| 4,542,453 A | * | 9/1985 | Patrick et al. ............... 714/6.13 |
| 6,049,672 A | * | 4/2000 | Shiell ...................... G06F 8/66 717/168 |
| 6,298,481 B1 | * | 10/2001 | Kosaka .............. G06F 9/44521 717/110 |
| 6,920,515 B2 | * | 7/2005 | Revilla ............... G06F 9/30149 710/260 |
| 7,039,776 B2 | * | 5/2006 | Wong et al. .................. 711/159 |

(Continued)

FOREIGN PATENT DOCUMENTS

| EP | 2023242 A1 | 2/2009 |
| EP | 2778905 A1 | 9/2014 |
| WO | 2011116672 A1 | 9/2011 |

*Primary Examiner* — Tuan V Thai
*Assistant Examiner* — Edward Waddy, Jr.
(74) *Attorney, Agent, or Firm* — Procopio, Cory, Hargreaves & Savitch LLP (57) ABSTRACT

A programmable memory 10 comprises programmable data bit cells. A data word comprises a group of the programmable data bit cells. A method of configuring patch code in the memory 10 comprises identifying a first location (e.g. 0x1234) in the programmable memory 10 where a patch is required; modifying a data word at the first location to a predetermined data value (e.g. 0xFFFF); writing patch code for the patch at a patch code location (e.g. 0xABCD); and storing the patch code location. The predetermined data value can be, or can map to, a value of an exception instruction of the processor 20 which will cause the processor 20 to read from a patch table 14. The programmable memory 10 can be a One Time Programmable (OTP) memory.

19 Claims, 7 Drawing Sheets

(56) References Cited

U.S. PATENT DOCUMENTS

| | | |
|---|---|---|
| 7,069,418 B2 * | 6/2006 | Weiss .................... G06F 9/3017 |
| | | 712/24 |
| 2002/0029357 A1 * | 3/2002 | Charnell et al. .................. 714/9 |
| 2002/0124161 A1 * | 9/2002 | Moyer ...................... G06F 8/66 |
| | | 712/234 |
| 2006/0107104 A1 * | 5/2006 | Alexandre et al. ............... 714/8 |
| 2008/0184072 A1 | 7/2008 | Odlivak et al. |
| 2008/0192541 A1 * | 8/2008 | Kang et al. ............. 365/185.03 |
| 2012/0096234 A1 * | 4/2012 | Jiang .................. G11C 11/5678 |
| | | 711/170 |

* cited by examiner

| | | |
|---|---|---|
| 1 0 1 1 0 1 0 1 0 1 1 1 0 1 0 1 | 1 1 1 1 1 1 1 1 1 1 1 1 1 1 1 1 | = PATCH POINT |
| 0 0 0 1 0 0 1 0 0 0 1 1 0 1 0 0 | 0 0 0 1 0 0 1 0 0 0 1 1 0 1 0 0 | = 0 |
| 1 0 1 0 1 1 1 0 1 0 1 0 0 1 0 1 ➤ | 1 1 1 1 1 1 1 1 1 1 1 1 1 1 1 1 | = 1 |
| 0 1 0 1 0 1 1 0 0 1 1 1 1 0 0 0 | 0 1 0 1 0 1 1 0 0 1 1 1 1 0 0 0 | = 0 |
| 1 0 1 0 1 0 1 0 1 0 1 0 1 0 1 0 | 1 1 1 1 1 1 1 1 1 1 1 1 1 1 1 1 | = 1 |

PATCHING OF PROGRAMMABLE MEMORY

BACKGROUND

The present invention relates to a system and method for the patching of programmable memory.

It is often desirable to be able to patch the contents of program memory after a device has been manufactured. For example, there may be a requirement to deploy an upgrade to software. Where devices utilise Random Access Memory (RAM), Flash, or other multiple-write types of memory such patches are straightforward as the existing content can simply be overwritten. However, in some types of device patching is more difficult.

One type of memory for which patching is more difficult is One Time Programmable (OTP) memory. OTP memory is computer memory that can be programmed only once. For example, in so-called anti-fuse memory at manufacture the unprogrammed state of each bit is '0' and it is possible to program each bit to a '1' such that the memory contains the required data. Once a bit has been changed to a '1' no further changes are possible to this bit. Another example of OTP is a write-once CD-ROM. A known technique for patching OTP memory is the inclusion of a comparator to compare an address requested by a processor utilising the memory with an address where a patch is required. If the comparator identifies a request for a patched address a multiplexor on the memory output is controlled to output the patched content rather than the original memory content. However, this system requires additional components for the comparator and multiplexor, with typically one comparator being required for each patched address. The use of this technique therefore adds complexity and cost to devices and can also require additional power to implement. The number of addresses that can be patched is also limited by the comparator and multiplexor configuration.

Another technique that has been used is to place a cache in front of the OTP memory and then lock patch code into cache lines. When the processor fetches data from the OTP memory address, the cache will instead provide the data from the locked cache lines. This scheme has a disadvantage of requiring a cache, which can add a significant amount of additional logic and power consumption if it must be provided especially for patching purposes.

There is therefore a requirement for an improved method and system for patching programmable memory.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

There is provided a method of configuring patch code for a programmable memory, the programmable memory comprising programmable data bit cells, wherein a data word comprises a group of the programmable data bit cells, the method comprising: identifying a first location in the programmable memory where a patch is required; modifying a data word at the first location to a predetermined data value; writing patch code for the patch at a patch code location; and storing the patch code location.

The programmable memory can be in communication with a processor.

The step of storing the patch code location can comprise storing the patch code location in a patch table. The predetermined data value can be a value of an exception instruction of the processor which will cause the processor to read from the patch table. Alternatively, the programmable memory can be in communication with logic for mapping the predetermined data value to a value of an exception instruction of the processor which will cause the processor to read the patch table.

The step of storing the patch code location in a patch table can comprise storing a correspondence between the patch code location and the first location.

The step of modifying a data word at the first location to a predetermined data value can further comprise modifying subsequent data words at the first location to indicate a position of the patch code location in the patch table.

The position of the patch code location in the patch table can be represented by a variable number of data words and the modifying subsequent data words can comprise modifying the number of data words such that all of the data bit cells of the number of data words are in a programmed state.

A group of data words can represent an index value which indicates the position of the patch code location in the patch table, wherein each bit of the index value is encoded by a different data word in the group of data words. One of the binary values (e.g. a binary value '1') of a bit of the index value can be encoded by modifying the data word such that all of the data bit cells of the data word are in a programmed state.

The step of storing the patch code location can comprise modifying subsequent data words at the first location to indicate the patch code location, where each bit of the patch code location is encoded by a different existing data word. One of the binary values (e.g. a binary value '1') of a bit of the patch code location can be encoded by modifying the existing data word such that all of the data bit cells of the existing data word are in a programmed state.

The step of modifying a data word at the first location to a predetermined data value can comprise modifying all of the data bit cells of the data word to a programmed state.

The step of writing patch code for the patch at a patch code location can write the patch code in the programmable memory.

There is also provided a method of operating a system comprising a processor and a programmable memory, the method comprising: reading a data word at a first location in the programmable memory and determining if a value of the data word corresponds to an exception instruction of the processor. If the value of the data word is determined to correspond to the exception instruction of the processor the method further comprises performing a look up in a patch table for a patch code location and reading data at the patch code location.

The method can comprise performing a logical operation on the data word read from the first location in the programmable memory to form a mapped value; and applying the mapped value to the processor. The step of determining if the value of the data word corresponds to an exception instruction of the processor is performed on the mapped value.

The patch table can comprise a correspondence between the patch code location and the first location.

The method can further comprise reading subsequent data words at the first location to determine a position of the patch code location in the patch table.

The position of the patch code location in the patch table can be represented by a variable number of data words and the method can further comprise determining the number of data words.

A group of data words can represent an index value which indicates the position of the patch code location in the patch table, wherein each bit of the index value is encoded by a different data word in the group of data words.

There is also provided a system comprising a programmable memory comprising programmable data bit cells, wherein a data word comprises a group of the programmable data bit cells, and a processor which is arranged to access the programmable memory and which is arranged to: identify a first location in the programmable memory where a patch is required; modify a data word at the first location to a predetermined data value; write patch code for the patch at a patch code location; and store the patch code location.

The processor can be arranged to: read a data word at a first location in the programmable memory and determine if a value of the data word corresponds to an exception instruction of the processor. If the value of the data word is determined to correspond to the exception instruction of the processor, the processor can be arranged to perform a look up in a patch table for a patch code location and read data at the patch code location.

The processor can be arranged to perform a logical operation on the data word read from the first location in the programmable memory to form a mapped data value and apply the mapped value to the processor. The processor can be arranged to use the mapped value when determining if the value of the data word corresponds to an exception instruction of the processor.

Advantageously, the programmable memory is a One Time Programmable (OTP) memory in which each data bit cell can only be programmed on a single occasion.

The preferred features may be combined as appropriate, as would be apparent to a skilled person, and may be combined with any of the aspects of the invention.

BRIEF DESCRIPTION OF THE DRAWINGS

Embodiments of the invention will be described, by way of example, with reference to the following drawings, in which.

Common reference numerals are used throughout the figures to indicate similar features.

DETAILED DESCRIPTION

Embodiments of the present invention are described below by way of example only. These examples represent the best ways of putting the invention into practice that are currently known to the Applicant although they are not the only ways in which this could be achieved. The description sets forth the functions of the example and the sequence of steps for constructing and operating the example. However, the same or equivalent functions and sequences may be accomplished by different examples.

In an OTP memory, each data cell of the memory representing a bit of information can have a binary value of '0' or '1'. For simplicity, it will be assumed in the following description that the unprogrammed state of a data bit cell is '0'. It should be understood that there are also OTP memory types where the unprogrammed state of a data bit cell is '0' and the principles described below can also be applied to that memory type.

All unprogrammed data bit cells initially have a binary value of '0'. A data word comprises a group (block) of data bit cells. For example, a group of 16 (or 32) data bit cells are used to store a 16 (or 32) bit data word. When a block of data bit cells are programmed to store a data word, each data bit cell within the block is set to a value of '1' (if a binary '1' is required in the bit of the data word) or left at the value of '0' (if a binary '0' is required in the bit of the data word). As a simple example, to store the 8 bit data word '0 0 0 0 1 1 1 1' in a block of data bit cells each of the first four data bit cells are left at their initial value '0' and the next four data bit cells are changed from '0' to '1' to represent the data value which needs to be stored. It is only possible to change the value of a data bit cell from '0' to '1'. Any bits that do need to be programmed are left at '0', but these bits can be subsequently programmed to '1' at any later time. The OTP memory can be an anti-fuse OTP memory, where each data bit cell has an anti-fuse which can be activated (programmed) to close an electrical connection in the data bit cell. The anti-fuse in each data bit cell can only be operated once during the lifetime of the OTP memory. The techniques described herein may be most appropriate to solid-state OTP, but may also be applied to any type of OTP storage such as Write-Once CD-ROMs.

Figure 1:
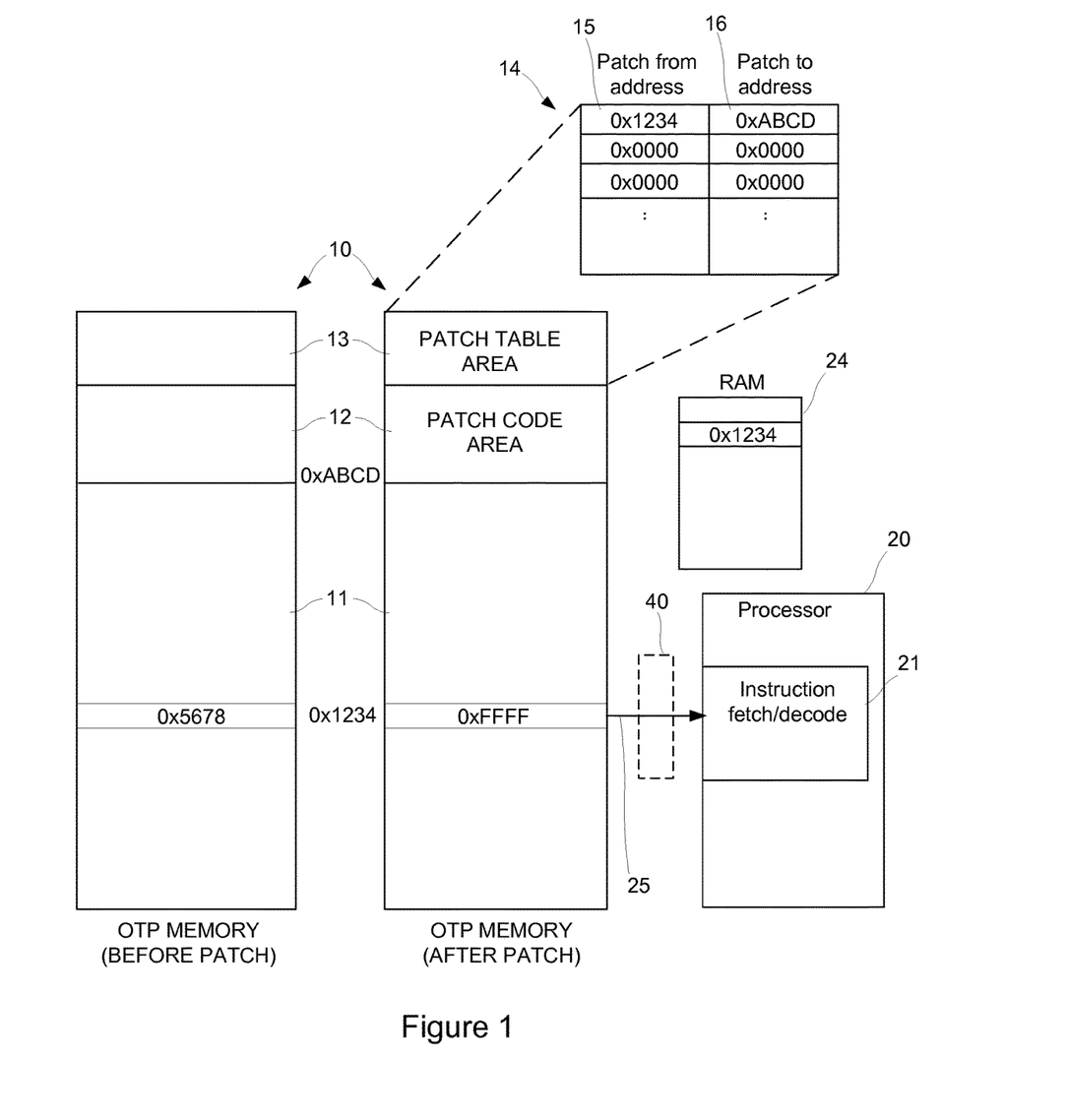
FIG. 1 shows an example of patching OTP memory.

FIG. 1 shows patching of an OTP memory according to an embodiment. In this example an OTP memory 10 is provided with three general areas 11, 12, 13. A conventional memory area 11 is provided for storing program code. A patch code area 12 is provided for storing code patches. A patch table area 13 is provided for storing a patch table 14. The patch table 14 stores a table of addresses where patch code is located. Initially, the memory area 11 is programmed with the software for the device, and the patch code area 12 and patch table area 13 are unprogrammed. FIG. 1 also shows a processor 20 with functionality 21 to fetch instructions from the OTP memory 10 and decode the instructions. A volatile memory, such as RAM 24, is also provided for storing data during operation of the processor 20. In operation, the processor 20 steps through locations of the OTP memory 10 and reads data words stored at each location. If a change is required to the code stored in the memory, then it necessary to replace the existing code in memory 10 with an alternative block of code, called a patch. The patch may be required to add new functionality, rectify a bug, or some other reason. In FIG. 1 the patch code area 12 and patch table area 13 are shown within the OTP memory, but those areas may be provided in any appropriate storage apparatus and do not necessarily have to be in the same apparatus as the area 11.

A location in OTP memory where a patch is required will be called a patch point. A data word at the patch point can be modified to a predetermined value. The predetermined value can trigger the processor 20 to perform a patch. In FIG. 1, the predetermined value is the all ones' state (0xFFFF). It is always possible to program a data bit cell of the OTP memory 10 from '0' to '1'. Therefore, the all ones' state (0xFFFF) can always be programmed at a location within memory, regardless of the existing value of the data word at that location.

Processors typically have an exception instruction which causes the processor to access a particular address to continue execution. The processor 20 is configured to treat the instruction 0xFFFF as an exception and, upon decoding of this instruction, to jump to predefined 'Patch Exception' code. The treatment of 0xFFFF as an exception instruction which causes the jump to the patch table may be part of the processors standard configuration, or this behaviour may be programmed by the manufacturer.

In the example of FIG. 1, a patch is required at location 0x1234 within memory 10. The patch code is located at address 0xABCD in area 12 of the OTP 10. When the processor reads 25 location 0x1234 from memory 10, it recognises the value 0xFFFF as an exception instruction and pushes the Program Counter (PC) on to the stack in RAM 24. The Program Counter (PC) is the address of the current location in memory 10. Exception handling code of the processor 20 causes the processor to read the address of the Program Counter/last memory location which was saved to RAM 24. In this example, the saved PC is 0x1234. Processor 20 searches the patch table 14 using the value "0x1234" as an index. In this example the patch table 14 stores one or more entries. Each entry comprises a correspondence between a "patch from address" 15 and a "patch to address" 16. The processor will find entry "0x1234" and a corresponding value "0xABCD" which represents the address in OTP where the patch code is located. The processor jumps to address 0xABCD and runs the patched code. The end of the code patch can include a suitable instruction to return to a location within the conventional memory area 11, or to another address in the patch code area 12. Further patches can be added to the patch code area 12. An entry is added to the patch table 14 for each new patch.

Figure 2:
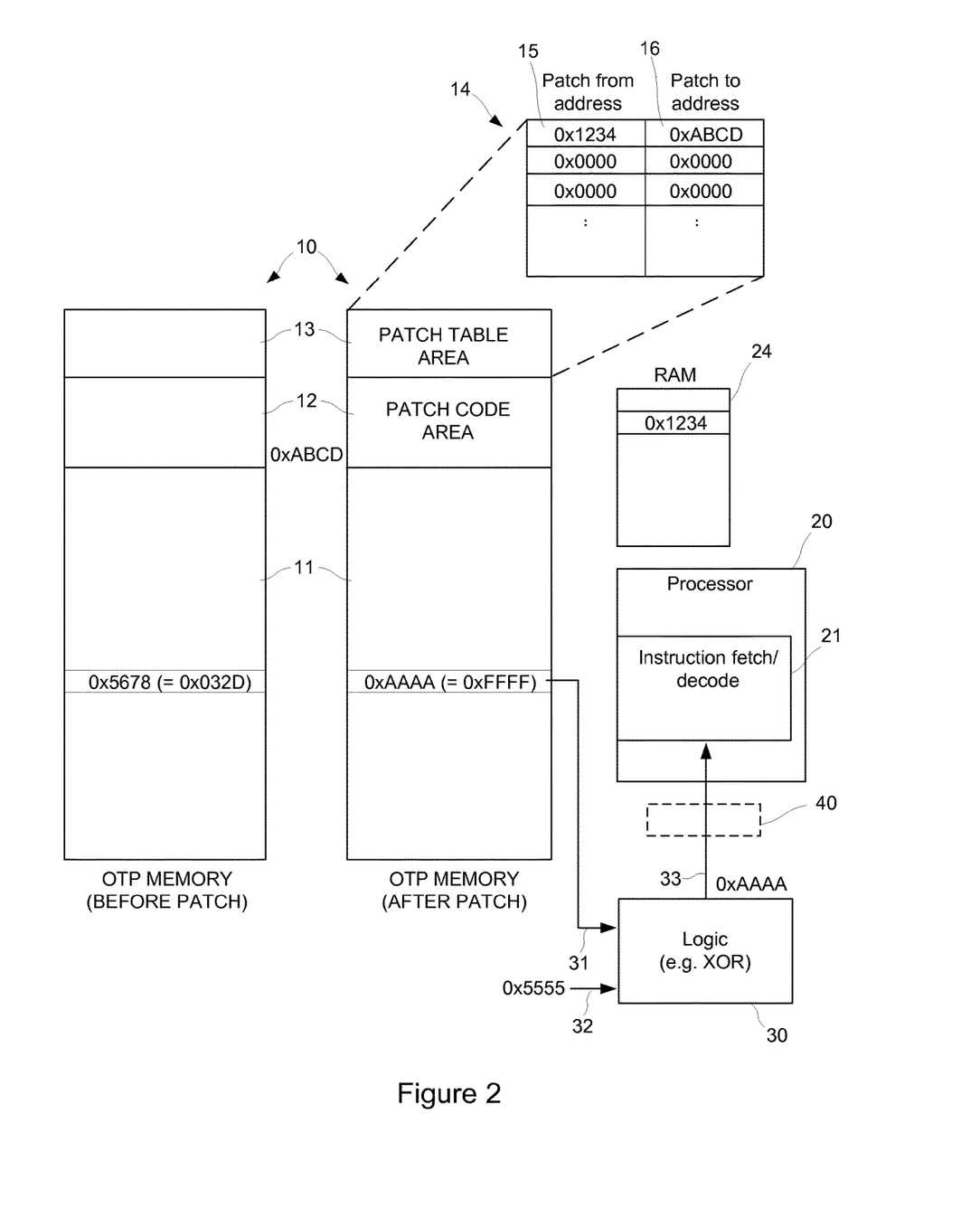
FIG. 2 shows another example of patching OTP memory.
Figure 3:
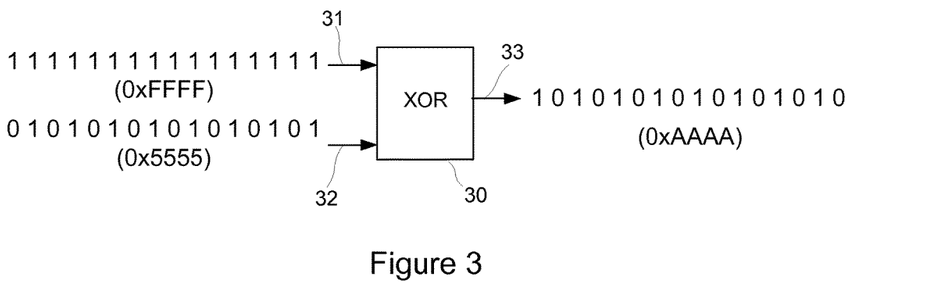
FIG. 3 shows logic used in the example of FIG. 2.

For many processors, the exception instruction which causes the processor to perform an exception does not have the value 0xFFFF, but some other value. FIG. 2 shows an embodiment which allows the processor 20 to use an exception instruction having a value which is different to the value 0xFFFF. Logic 30 is provided to operate on a value read from the memory 10. The logic receives the value from an address location at a first input 31 and a programmed value 32 at a second input 32 and performs a logic operation on the values received at the two inputs 31, 32. The logic 30 has the effect of mapping the data value read from the memory to a required value of the exception instruction. A data value is output 33 from the logic 30. In this example, the value 0xAAAA is the exception instruction of the processor 20 which will cause the processor to perform a look-up in the patch table 14. The logic 30 and input 32 are arranged such that whenever a value 0xFFFF is read from the memory, the exception instruction 0xAAAA is output 33 to the processor 20. In this example, the desired behaviour is possible by providing logic 30 which performs an exclusive OR (XOR) function on input 31 with a value 0x5555 on input 32. This is illustrated at a bit level in FIG. 3. An exclusive OR operation on the data words received at inputs 31, 32 results in the output 0xAAAA. So, the data value 0xFFFF stored in memory is mapped to the exception instruction 0xAAAA. The logical operation and/or value applied at input 32 can be changed to achieve any desired mapping, for example if 0x0000 was the exception instruction an inversion of all bits could be utilised, or for other values only certain bits may be inverted. It is possible to use a previously unused instruction encoding of the processor 20 as an exception instruction, or map to an existing exception encoding to achieve this operation.

In the configuration of FIG. 2 all data read from memory 10 is subject to the logic operation and therefore when 'normal' data is programmed it must be modified by the inverse logical operation such that the data actually received by the processor is the intended value and not the inverted value. For example, if a memory location is intended to provide '1010' to the processor, and the logical operation is an inversion of all bits, the value '0101' should be stored so that '1010' is delivered to the processor when the location is read.

Other features of FIG. 2 operate in the same way as previously described for FIG. 1.

In FIG. 1 and FIG. 2 a patch table 14 is provided. Each entry in the patch table 14 comprises an address in the memory area 11 (or 12) where a patch is to be performed, and an address where patch code is stored. One possible disadvantage of this arrangement is that, as more entries are added to the patch table 14, there may be an increase in the search time to find the "Patch from address" 15 as the patch table 14 is searched in sequence.

Figure 4:
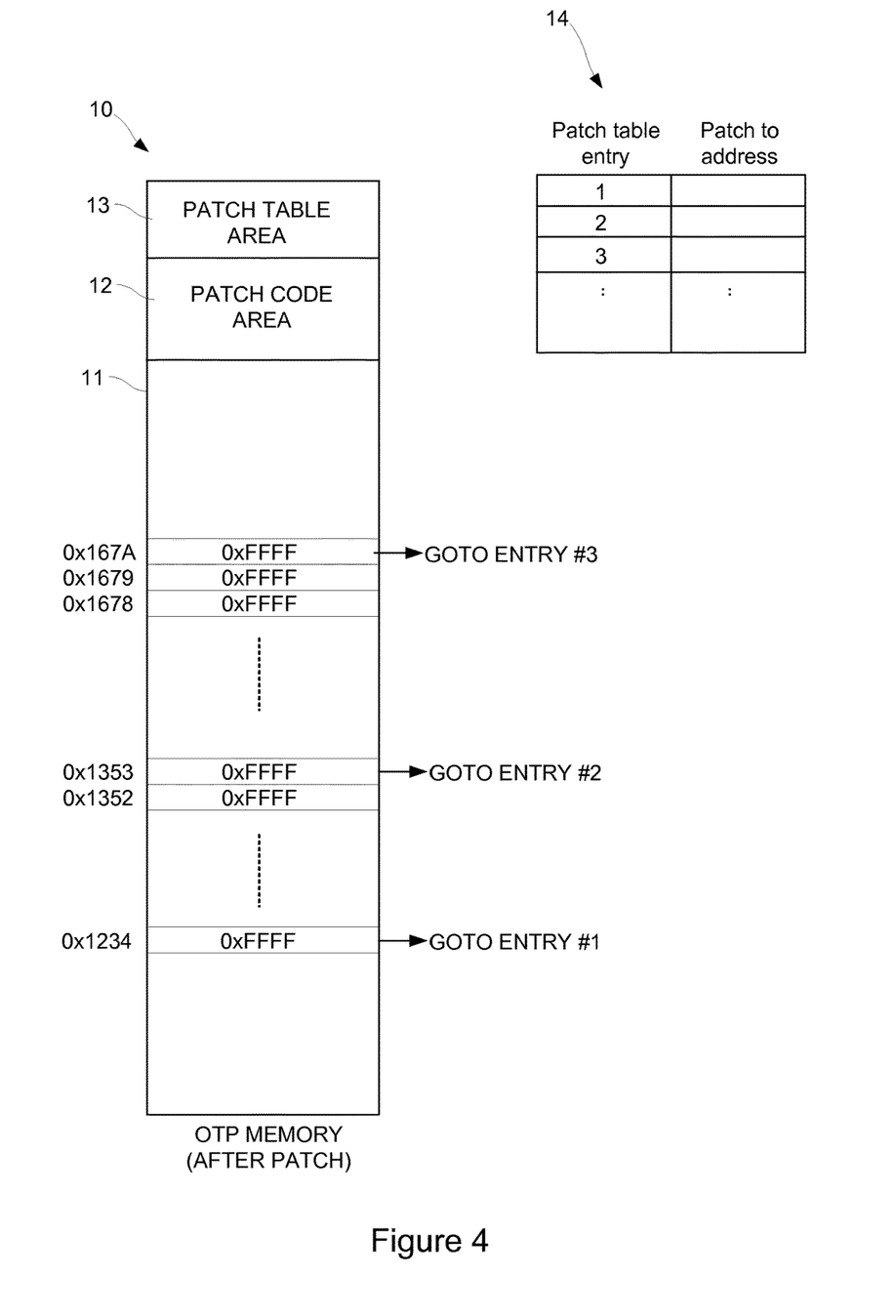
FIG. 4 shows a scheme for coding a patch number.
Figure 5:
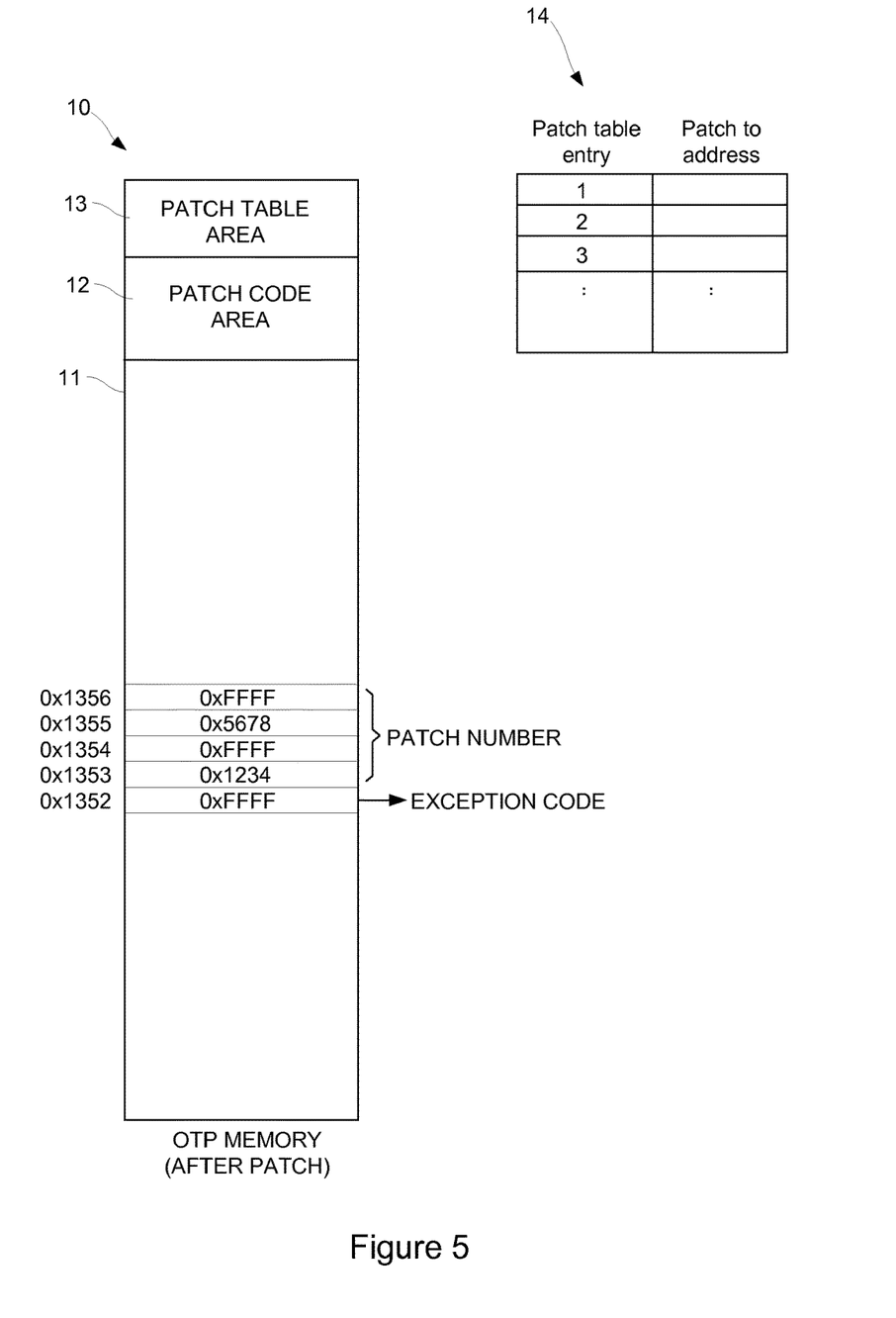
FIG. 5 shows another scheme for coding a patch number.

FIGS. 4 and 5 show some alternative implementations. In each of these alternatives, a patch point in memory area 11 (or 12) can comprise a plurality of data words with modified values. FIG. 4 shows the same memory 10 and a patch table 14. Three patch points in memory area 11 are show. As before, each patch point is identified by a first data word set to a predetermined value 0xFFFF which relates to an exception instruction of the processor. In this embodiment the exception causes the processor to read a predetermined number of subsequent memory entries to determine the location in the patch table it should refer to for the address of the next instruction. In the example of FIG. 4, the number of consecutive 0xFFFF entries indicates the row of the patch table to refer to. In this example the processor may read three entries which gives three possible rows of the patch table. This arrangement removes the need to search the patch table as the patched memory indicates the required row.

In the example of FIG. 4 a first patch point in memory 10 at 0x1234 comprises a single 0xFFFF value. This represents a first entry (ENTRY #1) in patch table 14. A second patch point in memory 10 at 0x01352 comprises two consecutive 0xFFFF values. This represents a second entry (ENTRY #2) in patch table 14. A third patch point in memory 10 at 0x01678 comprises three consecutive 0xFFFF values. This represents a third entry (ENTRY #2) in patch table 14, and so on.

In an alternative implementation the patch table may comprise a simple list of patch-to addresses. The patch-to address to utilise is identified by combining the entry number of the patch (as described in the preceding paragraphs) with the base address of the patch table which may be stored in a configuration register of the processor. When, using the method described above, a first patch point occurs the processor is caused to jump to the first entry in the patch table at the base address of that table. When a second patch point is identified the processor is caused to jump to the second entry in the patch table, identified as the memory location one higher than the base address. In this manner the particular required patch-to address can be identified without performing a search of the table.

FIG. 5 shows another alternative. As in FIG. 4 the exception instruction causes the reading of a number of memory locations. The values stored in those memory locations provide a code for the patch table entry. For example, the value 0xFFFF may indicate a binary 1 and any other value may indicate a binary 0. In the example of FIG. 5 location 0x1352 contains the exception code, and the subsequent four entries encode the binary value 0101, indicating row 5 of the patch table. The use of five memory locations as shown in FIG. 5 thus allows the encoding of 16 patch locations. As noted above this may avoid the need to search patch tables.

Figure 6:
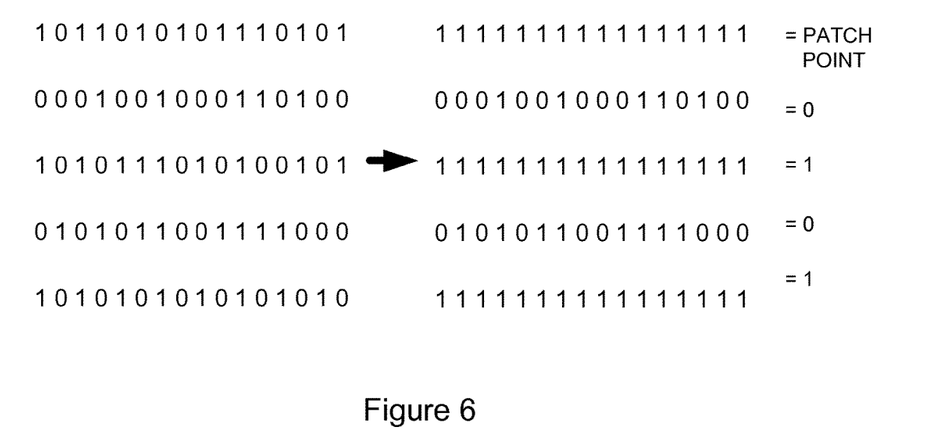
FIG. 6 shows binary data words before and after programming of a patch for the scheme of FIG. 5.

FIG. 6 shows the data words, in binary form, existing before the patch is programmed and the data words existing after the patch has been programmed, along with their encoded meaning.

Additional hardware or software function (40, FIGS. 1, 2) may be provided between the memory 10 and the processor 20. This additional function 40 inspects all content read from the memory 10 and, if the exception code (or a predetermined value) is identified, interrupts the passing of the value to the processor 20. The function 40 may simply not pass the value to the processor, or may trigger an interrupt to ensure timing rules are not contravened. The function 40 then reads the subsequent memory entries and receives the values. The function 40 decodes those entries as described above and issues an appropriate command (for example a particular exception, goto or interrupt command) to the processor to cause it to jump to the patch location identified by the read values. Alternatively, the function 40 may push the patch location on to the program counter, together with any command required, to cause the processor 20 to jump to the patch location (or to lookup the next value in the patch table).

The scheme shown in any of FIGS. 4, 5 and 6 can be combined with the disclosure of FIG. 2, so that a value 0xFFFF stored in memory can be converted to any required exception value of the processor 20.

In each of the embodiments described above a patch table 14 is provided and the patch table is used to find an address of where patch code is located. A further alternative is that the patch-to address is directly encoded at the patch point. For example, the encoding scheme described above and shown in FIG. 5 can be used to encode the patch-to address, without the need to use the patch table 14. This requires a larger number of data words at the patch point. As before, each patch point is identified by a first data word set to a predetermined value (e.g. 0xFFFF) which relates to an exception instruction of the processor, or a value which maps to an exception instruction of the processor.

In any of the embodiments described above, patch code can be stored in a patch code area 12 of the OTP 10 where the existing code is stored, or in a separate memory.

In any of the embodiments described above, the patch table 14 can be stored in a patch code table area 13 of the OTP 10 where the existing code is stored, or in a separate memory.

Figure 7:
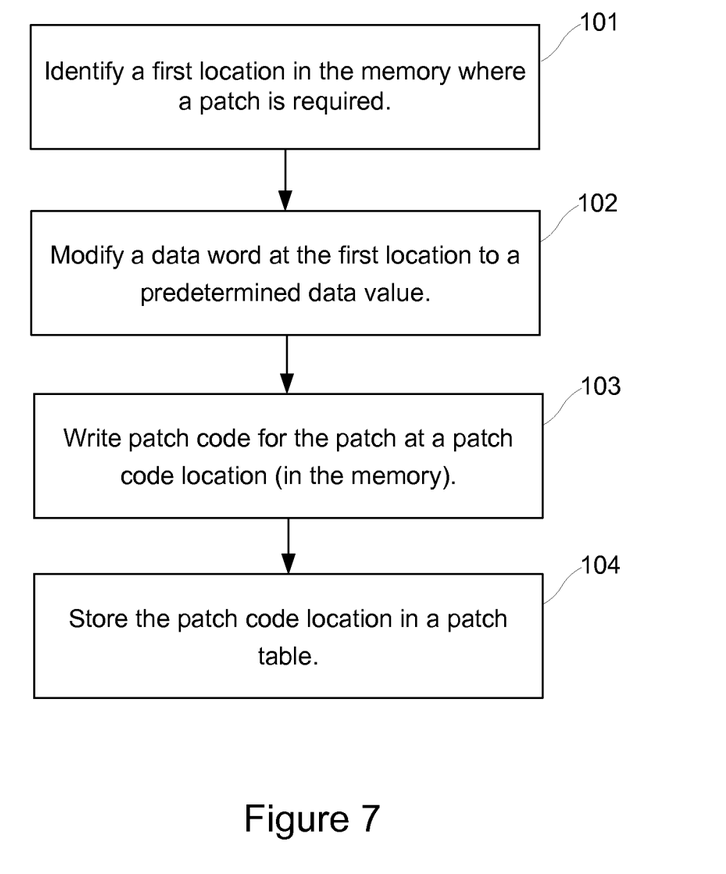
FIG. 7 shows a method of configuring patch code for a programmable memory.

FIG. 7 shows a method of configuring patch code for a programmable memory. Step 101 of the method comprises identifying a first location in the programmable memory where a patch is required. Step 102 of the method comprises modifying a data word at the first location to a predetermined data value. This can be the all ones state, 0xFFFF. Step 103 of the method comprises writing patch code for the patch at a patch code location. The patch code location can be a different area of the same OTP memory 10, or a different memory. Step 104 of the method comprises storing the patch code location in a patch table. The steps shown in FIG. 7 are not limited to the order shown. For example it may be desirable to perform step 103 first (write patch code) and then to perform step 104 (store patch code location) and step 102 (modify data word in memory).

Figure 8:
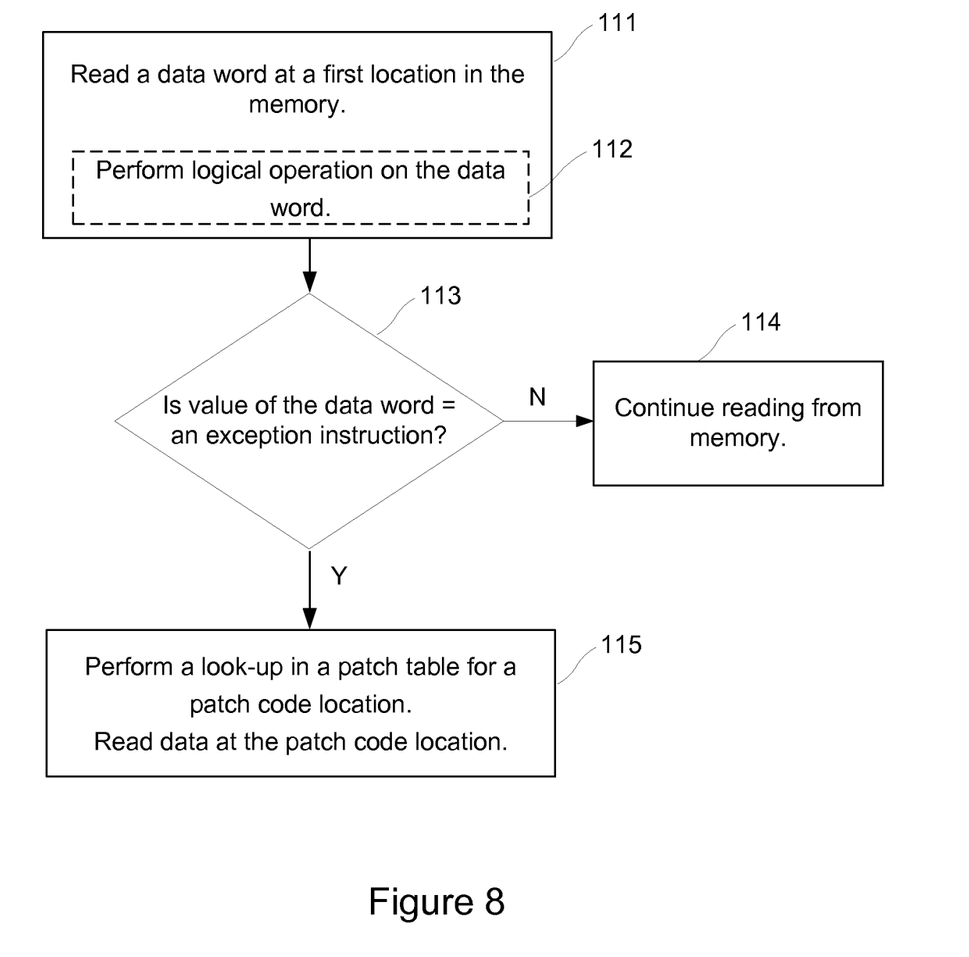
FIG. 8 shows a method of operating a system comprising a processor and a programmable memory.

FIG. 8 shows a method of operating a system comprising a processor and a programmable memory. Step 111 of the method comprises reading a data word at a first location in the programmable memory. An optional step 112 comprises performing a logical operation on the data word read from the first location in the programmable memory to form a mapped data value. Step 113 of the method comprises determining if a value of the data word (or the mapped value) corresponds to an exception instruction of the processor. If the value of the data word does not correspond to the exception instruction of the processor the method proceeds to step 114 and continues operating as normal. However, if the value of the data word is determined to correspond to the exception instruction of the processor the method proceeds to step 115 and performs a look-up in a patch table for a patch code location and then reads data at the patch code location.

As described above, the memory 10 can form part of a host system with a processor 20. The method of configuring patch code in the memory 10 and the method of operating a system can be performed by the processor 20 of the host system. For example, software upgrades during the lifetime of the host system may require the processor to configure patches. In an alternative embodiment, the patch may be configured in advance of distribution of the memory 10 to the host system.

An advantage of at least one embodiment is that no additional logic is required if the data value 0xFFFF can be used as the processor exception instruction. Even if the data value 0xFFFF cannot be used as the processor exception instruction, it is possible to implement an embodiment with a small amount of additional logic, such as an inverter for each bit of the instruction word which needs inverting. An instruction word is typically 16 or 32 bits, so the additional logic would typically amount to 16 or 32 inverters.

An advantage of at least one embodiment is an insignificant increase in power consumption, as the existing instruction decoder of the processor can be used to detect addresses that are marked for patching. Any additional power is only consumed when a patch is taken and then it is only related to the power consumed to search the patch table by the processor.

An advantage of at least one embodiment is that an unlimited number of patch points can be added, up to the limit of OTP capacity.

An advantage of at least one embodiment is that it is compatible with any processor that uses an exception instruction (i.e. almost all processors), as it possible to map the programmed OTP word (typically 0xFFFF) to any exception instruction through the use of inverters on the OTP read data output.

Any of the techniques described above can be applied to a reprogrammable memory, such as Flash, Compact Disc ReWritable (CD-RW), or one of the Digital Versatile Disc variants (DVD-RW, DVD+RW, DVD-RAM) where in certain applications it is not easy to erase the reprogrammable memory and a patch is more appropriate. In these cases the reprogrammable memory is being used like an OTP memory as far as patching is concerned. The memory can be a "few time programmable memory", such as a Flash memory which only allows a limited number of erase/program cycles. In this type of memory the need to erase and reprogram for each patch could quickly use the limited number of erase/program cycles of this type of memory. Patching in accordance with any of the techniques described above provides an alternative way of patching which allows a larger number of patch points.

Any range or device value given herein may be extended or altered without losing the effect sought, as will be apparent to the skilled person.

It will be understood that the benefits and advantages described above may relate to one embodiment or may relate to several embodiments. The embodiments are not limited to those that solve any or all of the stated problems or those that have any or all of the stated benefits and advantages.

Any reference to 'an' item refers to one or more of those items. The term 'comprising' is used herein to mean including the method blocks or elements identified, but that such blocks or elements do not comprise an exclusive list and a method or apparatus may contain additional blocks or elements.

The steps of the methods described herein may be carried out in any suitable order, or simultaneously where appropriate. Additionally, individual blocks may be deleted from any of the methods without departing from the spirit and scope of the subject matter described herein. Aspects of any of the examples described above may be combined with aspects of any of the other examples described to form further examples without losing the effect sought.

It will be understood that the above description of a preferred embodiment is given by way of example only and that various modifications may be made by those skilled in the art. Although various embodiments have been described above with a certain degree of particularity, or with reference to one or more individual embodiments, those skilled in the art could make numerous alterations to the disclosed embodiments without departing from the spirit or scope of this invention.

The invention claimed is:

1. A method of configuring patch code for a one time programmable memory, the one time programmable memory comprising a plurality of data words, each data word of the plurality of data words comprising a plurality of programmable data bit cells, the method comprising:
   identifying a first location in the one time programmable memory where a patch is required;
   modifying a data word of the plurality of data words at the first location to a predetermined data value, the predetermined data value is a value which will cause the processor to read from a patch table;
   writing patch code for the patch at a patch code location; and
   storing the patch code location in the patch table.

2. The method according to claim 1, wherein the one time programmable memory is in communication with a processor.

3. A method according to claim 2 wherein the step of storing the patch code location comprises storing the patch code location in the patch table and wherein the one time programmable memory is in communication with logic for mapping the predetermined data value to a value of an exception instruction of the processor which will cause the processor to read the patch table.

4. A method according to claim 1 wherein the step of storing the patch code location in the patch table further comprises storing a correspondence between the patch code location and the first location.

5. A method according to claim 1 wherein the step of storing the patch code location comprises storing the patch code location in the patch table and wherein the step of modifying a data word at the first location to the predetermined data value further comprises modifying subsequent data words at the first location to indicate a position of the patch code location in the patch table.

6. A method according to claim 5 wherein the position of the patch code location in the patch table is represented by a variable number of data words and the modifying subsequent data words comprises modifying the number of data words such that all of the data bit cells of the number of data words are in a programmed state.

7. A method according to claim 5 wherein a group of data words represent an index value which indicates the position of the patch code location in the patch table, wherein each bit of the index value is encoded by a different data word in the group of data words, and wherein one of the binary values of a bit of the index value is encoded by modifying the data word such that all of the data bit cells of the data word are in a programmed state.

8. A method according to claim 1 wherein the step of storing the patch code location comprises modifying subsequent data words at the first location to indicate the patch code location, where each bit of the patch code location is encoded by a different existing data word, and wherein one of the binary values of a bit of the patch code location is encoded by modifying the existing data word such that all of the data bit cells of the existing data word are in a programmed state.

9. A method according to claim 1 wherein the predetermined data value is a value associated with each data bit cell of the plurality of the programmable data bit cells at the first location being in a programmed state.

10. A method according to claim 1 wherein the step of writing patch code for the patch at the patch code location writes the patch code in the one time programmable memory.

11. A method of operating a system comprising a processor and a one time programmable memory, the method comprising:
    reading a data word at a first location in the one time programmable memory;
    determining if a value of the data word corresponds to an exception instruction of the processor, the exception instruction corresponding to a predetermined data value for all bits of the data word at the first location being in a programmed state which will cause the processor to read from a patch table; and
    if the value of the data word is determined to correspond to the predetermined data value:
        performing a look up in the patch table for a patch code location stored in the patch table; and
        reading data at the patch code location.

12. A method according to claim 11 further comprising:
    performing a logical operation on the data word read from the first location in the one time programmable memory to form a mapped value; and
    applying the mapped value to the processor,
    wherein the step of determining if the value of the data word corresponds to an exception instruction of the processor is performed on the mapped value.

13. A method according to claim 11 wherein the patch table comprises a correspondence between the patch code location and the first location.

14. A method according to claim 11 further comprising reading subsequent data words at the first location to determine a position of the patch code location in the patch table.

15. A method according to claim 14 wherein the position of the patch code location in the patch table is represented by a variable number of data words and the method further comprises determining the number of data words.

16. A method according to claim 14 wherein a group of data words represent an index value which indicates the position of the patch code location in the patch table, wherein each bit of the index value is encoded by a different data word in the group of data words.

17. A system comprising:
- a one time programmable memory comprising programmable data bit cells, wherein a data word comprises a group of the programmable data bit cells;
- a processor which is arranged to access the one time programmable memory and which is arranged to:
  - identify a first location in the one time programmable memory where a patch is required;
  - modify a data word at the first location to a predetermined data value, the predetermined data value corresponding to the data value for all bits of the data word at the first location being in a programmed state and the predetermined data value is a value which will cause the processor to read from a patch table;
  - write patch code for the patch at a patch code location; and
  - store the patch code location in the patch table.

18. A system according to claim 17 wherein the processor is arranged to:
- read a data word at the first location in the one time programmable memory;
- determine if a value of the data word corresponds to an exception instruction of the processor; and
- if the value of the data word is determined to correspond to the exception instruction of the processor:
  - perform a look up in patch table for the patch code location; and
  - read data at the patch code location.

19. A system according to claim 18 wherein the processor is arranged to:
- perform a logical operation on the data word read from the first location in the one time programmable memory to form a mapped data value;
- apply the mapped value to the processor; and
- use the mapped value when determining if the value of the data word corresponds to the exception instruction of the processor.

* * * * *